(12) United States Patent
Guyot-Sionnest et al.

(10) Patent No.: US 7,227,177 B2
(45) Date of Patent: *Jun. 5, 2007

(54) DOPED SEMICONDUCTOR NANOCRYSTALS

(75) Inventors: Philippe Guyot-Sionnest, Chicago, IL (US); Moonsub Shim, Mountain View, CA (US); Conjun Wang, Chicago, IL (US)

(73) Assignee: Arch Development Corporation, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/111,153

(22) Filed: Apr. 21, 2005

(65) Prior Publication Data

US 2005/0189534 A1    Sep. 1, 2005

Related U.S. Application Data

(63) Continuation of application No. 09/694,090, filed on Oct. 19, 2000, now Pat. No. 6,939,604.

(51) Int. Cl.
*H01L 21/00* (2006.01)
*H01L 31/06* (2006.01)

(52) U.S. Cl. .......................... 257/21; 257/22; 257/461; 257/465; 257/12; 257/44; 257/94; 257/102; 257/103

(58) Field of Classification Search ............... None
See application file for complete search history.

(56) References Cited

U.S. PATENT DOCUMENTS

| | | | |
|---|---|---|---|
| 4,529,832 A | 7/1985 | Sher et al. | |
| 5,446,286 A | 8/1995 | Bhargava et al. | |
| 5,537,000 A | 7/1996 | Alivisatos et al. | |
| 5,985,173 A | 11/1999 | Gray et al. | |
| 6,048,616 A | 4/2000 | Gallagher et al. | |
| 6,057,561 A | 5/2000 | Kawasaki et al. | |
| 6,207,229 B1 | 3/2001 | Bawendi et al. | |
| 6,241,819 B1 | 6/2001 | Bhargava et al. | |
| 6,342,313 B1 | 1/2002 | White et al. | |
| 6,939,604 B1 * | 9/2005 | Guyot-Sionnest et al. | .. 428/323 |

OTHER PUBLICATIONS

C. B. Murray, C. R. Kagan, and M. G. Bawendi, *Annu. Rev. Mater. Sci.* 30, 545 (2000).
C. B. Murray, D. J. Norris, and M. G. Bawendi, *J. Am. Chem. Soc.* 115, 8706 (1993).
J. E. Bowen Katari, V. L. Colvin, and A. P. Alivisatos, *J. Phys. Chem.* 98, 4109 (1994).

(Continued)

*Primary Examiner*—Evan Pert
*Assistant Examiner*—Fazli Erdem
(74) *Attorney, Agent, or Firm*—Brinks Hofer Gilson & Lione, Inc.

(57) ABSTRACT

A particle, includes a semiconductor nanocrystal. The nanocrystal is doped.

7 Claims, 5 Drawing Sheets

OTHER PUBLICATIONS

M. A. Hines and P. Guyot-Sionnest, *J. Phys. Chem.* 100, 468 (1996).

S. Flink et al *J. Phys. Chem. B* 103, 6515 (1999).

Bruchez Jr., M., Moronne, M., Gin, P., Weiss, S. & Alivisatos, A.P. *Science* 281, 2013-2016 (1998).

Chan, W. C. W. & Nie, S. *Science* 281, 2016-2018 (1998).

Lee J, et al. *Adv. Mater.* 12, 1102 (2000).

Guyot-Sionnest, P. & Hines, M. A. *Appl. Phys. Lett.* 72, 686-688 (1998).

Shim, M., Shilov, S. V., Braiman, M. S. & Guyot-Sionnest, P. *J. Phys. Chem.* 104, 1494-1496 (2000).

Mokerov VG, Nalbandov BG, Shmelev SS, Amelin VP *Journal Of Communications Technology And Electronics* 44: (11) 1187-1197 (1999).

Dabbousi, B. O.; Rodriguez-Viejo, J.; Mikulec, F. V.; Heine, J. R.; Mattoussi, H.; Ober, R.; Jensen, K. F.; Bawendi, M. G. *J. Phys. Chem. B* 101, 9463-9475 (1997).

Peng, X. et al. *J. Am. Chem. Soc.* 1997, 119, 7019-7029.

Cao, Y.; Banin, U. *Angew. Chem. Int. Ed.* 1999, 38, 3692-3694.

Nirmal, M. et al. *Nature* 1996, 383, 802-804.

Meyer, Adv. Mater. 10, 439 (1998).

R. E. Wittrig, and C. P. Kubiak, *J. Electroanal. Chem.* 393, 75 (1995).

\* cited by examiner

DOPED SEMICONDUCTOR NANOCRYSTALS

REFERENCE TO RELATED APPLICATION

This is a continuation application of U.S. application Ser. No. 09/694,090, filed on Oct. 19, 2000, now U.S. Pat. No. 6,939,604 (incorporated by reference in its entirety).

FEDERALLY SPONSORED RESEARCH OR DEVELOPMENT

The subject matter of this application was in part funded by the National Science Foundation (Grant No. DMR-9731642). The government may have certain rights in this invention.

BACKGROUND

The present invention relates to semiconductor nanocrystals.

Semiconductor nanocrystals are very small crystallites of semiconductor material, also known as quantum dots, which have the opto-electronic properties of semiconductors. They are typically prepared as colloids, and as such, display physico-chemical properties of molecules.

A striking feature of semiconductor nanocrystals is that their color may be controlled by their size. This is a direct consequence of quantum confinement on the electronic states, giving these nanocrystals great potential in systems, such as light emitting diodes, photovoltaic cells and future nanoelectronic devices. For these and other applications, it would be desirable to control the electron occupation of the nanocrystals, in the same manner as n- and p-type doping is used to control the electron occupation in bulk semiconductors.

Attempts to dope semiconductor nanocrystals by introducing impurity atoms, as is typically done with bulk semiconductors, have been unsuccessful. Impurities tend to be expelled from the small crystalline cores. Furthermore, thermal ionization of the impurities to provide free carriers in the nanocrystals is hindered by the strong confinement that results from the small size of the nanocrystals. Finally, some attempts at doping have resulted in charge being trapped in surface states, not in the quantum-confined states of the nanocrystals.

BRIEF SUMMARY

In a first aspect, the present invention is a particle, including a semiconductor nanocrystal. The nanocrystal is doped.

In a second aspect, the present invention is a method of making a particle, including adding at least one carrier to a semiconductor nanocrystal, to form a doped semiconductor nanocrystal.

In a third aspect, the present invention is a film including doped semiconductor nanocrystals.

In a fourth aspect, the present invention is a colloid including doped semiconductor nanocrystals.

In a fifth aspect, the present invention is a display including doped semiconductor nanocrystals.

In a sixth aspect, the present invention is an opto-electronic device including doped semiconductor nanocrystals.

In a seventh aspect, the present invention is an n-p junction including doped semiconductor nanocrystals.

Definitions

The term "doped" means that the nanocrystal contains at least one added carrier, either one or more electrons or one or more holes, in quantum-confined states.

The term "dopant" means the added carrier or carriers in a doped 20 semiconductor nanocrystal.

The term "n-doped" means that the added carrier or carriers are electrons.

The term "p-doped" means that the added carrier or carriers are holes.

The term "semiconductor" means a material that is semiconducting, as opposed to metallic. Examples of semiconductors include carbon (in the diamond structure), silicon, germanium, and mixtures thereof; titanium dioxide, aluminum oxide; 2–6 semiconductors, which are compounds of at least one divalent metal (zinc, cadmium, mercury and lead) and at least one divalent non-metal (oxygen, sulfur, selenium, and telurium) such as zinc oxide, cadmium selenide, cadmium sulfide, mercury selenide, and mixtures thereof; and 3–5 semiconductors, which are compounds of at least one trivalent metal (aluminum, gallium, indium, and thalium) with at least one trivalent non-metal (nitrogen, phosphorous, arsenic, and antimony) such as gallium arsenide, indium phosphide, and mixtures thereof.

The term "nanocrystal" means a particle having an average diameter, as determined by transmission electron microscopy, of 1 to 100 nm, preferably 2 to 50 nm, more preferably 2 to 30 nm.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

The present invention includes doped semiconductor nanocrystals. These nanocrystals contain carriers in quantum-confined states, rather than carriers trapped in surface states. They may be formed by a variety of methods, including reduction or oxidation by chemical agents, or electrochemically. Once formed, they display unexpected properties, such as quenched fluorescence with the inclusion of as few as one or two carriers.

Semiconductor nanocrystals have been know for many years, and the preparation of these material is described in C. B. Murray, C. R. Kagan, and M. G. Bawendi, *Annu. Rev. Mater. Sci.* 30, 545 (2000); C. B. Murray, D. J. Norris, and M. G. Bawendi, *J. Am. Chem. Soc.* 115, 8706 (1993); and J. E. Bowen Katari, V. L. Colvin, and A. P. Alivisatos, *J. Phys. Chem.* 98, 4109 (1994). Preferably, they are prepared as colloids. In the form of colloids, they are easily manipulated. The colloids may be mixed with a solvent including nonpolar and polar organic solvents, such as alkanes (for example, hexane and pentane), ethers (diethyl ether and tetrahydrofuran), benzene, toluene, styrene, dichloromethane, styrene, xylene, dimethyl formamide (DMF), carbonates (propylene carbonate), dimethyl sulfoxide (DMSO), and mixtures thereof.

Semiconductor nanocrystals may be formed as mixtures with a core-shell structure. In this form a first composition will form the core (for example, CdSe), and this core will be surrounded by a shell of a second composition (for example ZnS). The preparation of these material is described in M. A. Hines and P. Guyot-Sionnest, *J. Phys. Chem.* 100, 468 (1996). Examples include core/shell pairs CdSe/ZnS, CdSe/CdS, InAs/CdSe, InAs/InP, ZnS/CdSe, CdS/CdSe, CdSe/InAs and InP/As.

Semiconductor nanocrystals may be formed with capping groups on their surfaces. Capping groups are moieties that are attached to the surface of the semiconductor nanocrystals, and are included during the synthesis of colloidal nanocrystals. Examples of capping groups include phosphine oxides, such as trioctylphosphine oxide (TOPO), and thiolates, such as propane thiolate. Capping groups also include charged capping groups, such as trimethyl ammonium propane thiolate, and ion sequestering capping groups, such as crown ether thiolates, for example 2-[(6-mercaptohexyl)oxy]methyl-12-crown-4. When a crown ether thiolate has sequestered an ion, for example a sodium ion, then it would be a charged capping group. Using these ion sequestering capping groups that can bind to cations or anions, added Coulomb interaction between the doped semiconductor nanocrystal and its counter ion may lead to improved stability. Such molecules have demonstrated selective adsorption of alkali cations, as described in S. Flink et al J. Phys. Chem. B 1999, 103, 6515.

Figure 2:
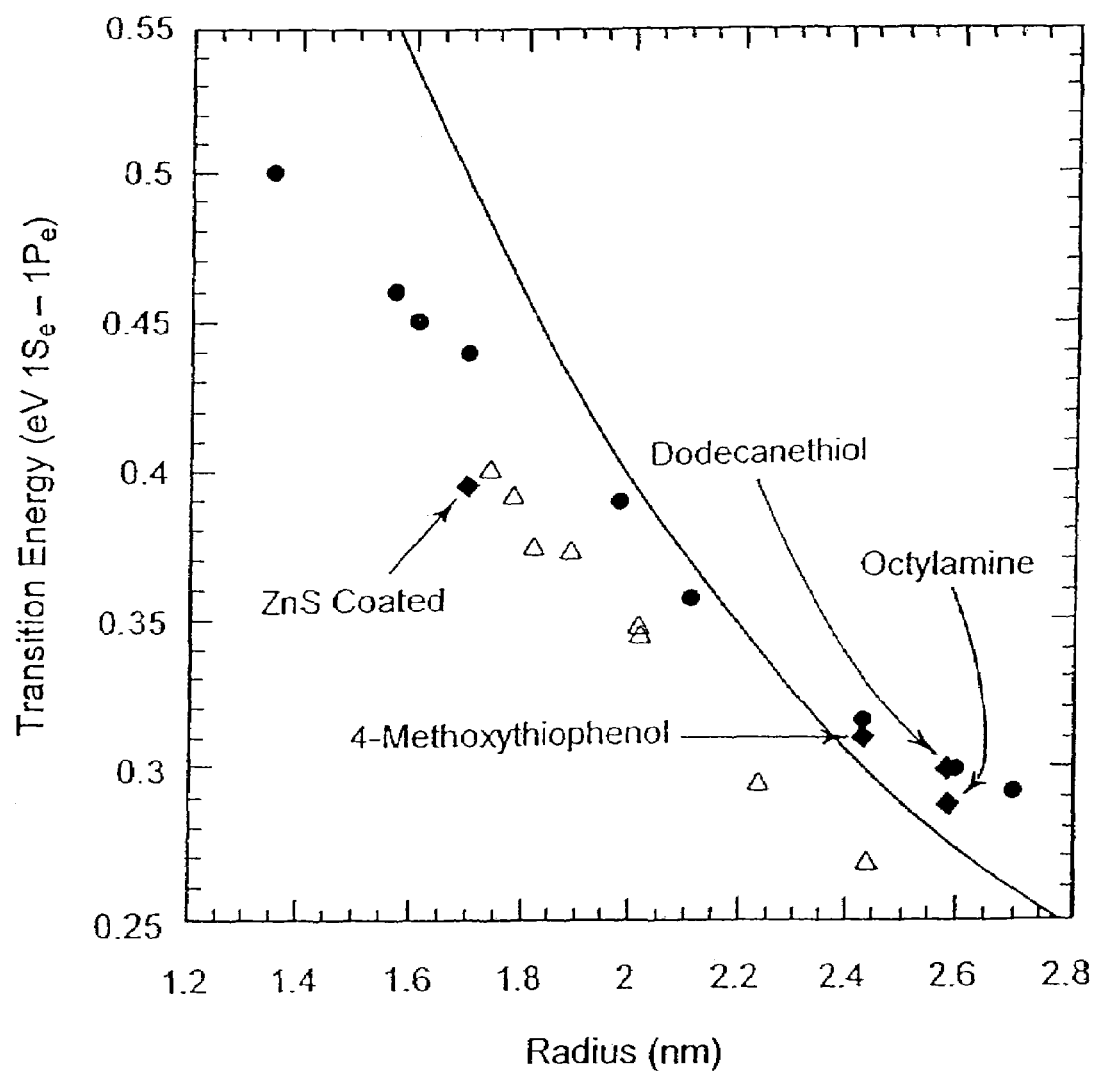
FIG. 2. Experimental $1S_e$-$1P_e$ transition energy of n-type CdSe nanocrystals capped with TOPO (filled circles), optically excited nanocrystals (open triangles) and effective mass calculation[3] (solid line). The filled diamonds are the same transition energy for n-type CdSe nanocrystals with various capping groups as indicated. The IR absorption band is easily tuned with size and its position can be readily determined from bulk properties.

An advantageous properties of semiconductor nanocrystals prepared as colloids is the capping group. The readily exchangeable capping group allows for a versatile manipulation of nanocrystals in many different environments. Recapping nanocrystals with organic functional groups that are compatible with physiological environments has shown that nanocrystals can be useful biological tags, as described in Bruchez Jr., M., Moronne, M., Gin, P., Weiss, S. & Alivisatos, A. P. *Science* 281, 2013–2016 (1998); and Chan, W. C. W. & Nie, S. *Science* 281, 2016–2018 (1998). The electron injection into the $1S_e$ state is also achieved in nanocrystals with different capping groups, as indicated in FIG. 2. Preferably, the capping layer does not introduce electron traps within the band gap. The capping layer also provides an avenue to improve the long-term stability of an n-doped nanocrystal.

Films of semiconductor nanocrystals may be prepared, for example, by applying colloidal semiconductor nanocrystals in a solvent onto a surface, and evaporating the solvent. The surface may be the surface of any substrate, such as a glass, quartz, a metal, a plastic (for example a transparent polymer), a ceramic, or even a natural material (for example, wood).

The semiconductor nanocrystal may also be formed into a composite material. A composite of semiconductor nanocrystals with a polymer may be formed by using a liquid monomer as a solvent for colloidal semiconductor nanocrystals, and then polymerizing the monomer, as described in Lee J, et al., "Full Color Emission From II-VI Semiconductor Quantum Dot-Polymer Composites" Adv. Mater. 12, 1102, 2000. For example, styrene could be used as the solvent for colloidal semiconductor nanocrystals, and then the styrene may be polymerized by the addition of benzyl peroxide; the resulting composite would be semiconductor nanocrystals in a matrix of polystyrene. By selecting appropriate monomers and monomer mixtures, an enormous variety of composites of semiconductor nanocrystals and polymers or copolymers, including electrically conductive polymers or copolymers, are possible. Alternatively, composites may be formed by dissolving the semiconductor nanocrystals in a solvent containing a disolved polymer and drying the mixture.

Once formed, the semiconductor nanocrystals may be doped. A variety of methods may be used to dope the semiconductor nanocrystals, including chemical doping, electrochemical doping, and doping by light induced electron transfer.

Chemical doping may be carried out by contacting the semiconductor nanocrystal to a reducing agent or an oxidizing agent. For example, exposing the semiconductor nanocrystals to sodium metal, as a reducing agent, will form n-doped semiconductor nanocrystals. Examples of reducing agents include metals such as lithium, sodium, potassium, rubidium, cesium, calcium, strontium, barium, aluminum, amalgams and alloys containing these metals. Exposing semiconductor nanocrystals to an oxidizing agent may form p-doped semiconductor nanocrystals. Examples of oxidizing agents include halogens, such as chlorine, bromine and iodine; and compounds such as molybdenum hexafluoride, silver difluoride and ferric chloride. Optionally, a charge shuttle may be included, to improve the rate at which doping takes place; examples of charge shuttles include biphenyl, naphthalene, and anthracene.

Electrochemical doping may be carried out by forming a mixture of a solvent and colloidal semiconductor nanocrystals, together with an electrolyte. A working electrode and counter electrode are placed in electrical contact with the mixture, preferably also with a reference electrode, and a voltage is applied across the working and counter electrodes. The voltage is selected as necessary to dope (either n-doping or p-doping) the semiconductor nanocrystals, and the reaction may be monitored spectroscopically. Solvents are chosen that will support the colloidal semiconductor nanocrystals and that will dissolve the electrolyte; examples include tetrahydrofuran (THF), dimethyl formamide (DMF), carbonates such as propylene carbonate, dimethyl sulfoxide (DMSO), and mixtures thereof. Electrolytes must dissolve in the chosen solvent, and include salts such as tetrabutylammonium perchlorate (TBAP).

As a film, the semiconductor nanocrystals may be doped chemically, for example by evaporation of sodium metal onto the film, or electrochemically, for example when the film has been formed on an electrically conducting substrate. Furthermore, once the semiconductor nanocrystals have been doped, they may be formed into the film; for example, a colloid of doped semiconductor nanocrystals in a hydrocarbon solvent may be applied to a glass surface, and then the hydrocarbon is allowed to evaporate, forming a film of doped semiconductor nanocrystals. A recent account on the preparation and properties of solid films of semiconductor nanocrystals that are not doped is given by Murray C B, Kagan C R, Bawendi M G, Synthesis and Characterization of Monodisperse Nanocrystals and Close-Packed Nanocrystal Assemblies, Annu. Rev. Mater. Sci. 30: 545–610 2000. The same procedures are applicable to n- or p-doped colloidal semiconductor nanocrystals.

A doped semiconductor nanocrystal will have a carrier in a quantum-confined state. These are delocalized states, in contrast to a semiconductor nanocrystal that includes an electron or hole in a trapped state, typically a surface state; such a particle is not doped. Infrared (IR) spectroscopy may be used to determine if a carrier is in a quantum-confined state, by observation of an intraband transition, such as the $1S_e$-$1P_e$ intraband transition.

Quantum-confined states are orbitals that are delocalized. When a carrier is in a quantum-confined state, the semiconductor nanocrystal will exhibit a strong electrically allowed transition that does not appear in the corresponding semiconductor nanocrystal that is not doped. For example, in a corresponding semiconductor nanocrystal that is not doped, electrons will fill all orbitals with an energy below and including the highest occupied quantum-confined orbital (HOQCO). The next highest energy orbital will be empty, the lowest unoccupied quantum-confined orbital (LUQCO). Upon doping, with an electron as the dopant (forming an n-doped semiconductor nanocrystal), an electron will now be present in the LUQCO. Using IR spectroscopy, this electron can be detected by its transition from the LUQCO to the next highest orbital.

Similarly, if the dopant is a hole, a hole will now be present in the HOQCO, and using IR (far or mid IR) spectroscopy, this hole can be detected by the transition of an electron from the next lowest orbital to the HOQCO. Therefore, by comparing the IR spectrum of the semiconductor nanocrystal that is not doped and the semiconductor nanocrystal in an unknown condition, it can be determined if the semiconductor nanocrystal in an unknown condition is doped.

When doped, the semiconductor nanocrystals will also exhibit a bleach of the exciton transition. However, this may also occur if the carriers are in trapped states. Furthermore, an intraband transition may also be observed in photoexcited nanocrystals, as described in Guyot-Sionnest, P. & Hines, M. A. *Appl. Phys. Lett.* 72, 686–688 (1998); and Shim, M., Shilov, S. V., Braiman, M. S. & Guyot-Sionnest, P. *J. Phys. Chem.* 104, 1494–1496 (2000). However, these photoexcited semiconductor nanocrystals are not doped, since the carriers present are not added, but rather generated internally as electron-hole pairs.

Photo doping (as opposed to photoexcitation) may also be done using staggered band-gap configuration in core-shell structure. Such a structure would naturally lead to charge separation after photoexcitation, and may improve the stability of n- or p-doped cores by providing the counterchage in the shell (which would then be the corresponding p- or n-doped). A graded interface may further improve the charge separation. One example of such structure is core shell (CdSe)ZnTe nanocrystals, where the electron would be stabilized in the core (an n-doped semiconductor nanocrysal) and the hole in the shell (a p-doped semiconductor nanocrystal). Core-shell semiconductor nanocrystal colloids are easily synthesized, although the emphasis in the literature has been on semiconductor in the normal configuration, with the outside material having a gap that extends above and below the inner gap to enhance luminescence rather than charge separation.

A staggered core/shell structure with a deep impurity level in the shell may be a stable case of n- or p-doping of the core as an electron is transferred between the core and shell to accommodate the valency of the impurity. This is similar to delta-doping used in current high speed electronic systems, where the dopant is spatially removed from the active layer (High-speed integrated circuits in A(3)B(5)-semiconductor compound nanostructures, as described in a survey, Mokerov V G, Nalbandov B G, Shmelev S S, Amelin V P JOURNAL OF COMMUNICATIONS TECHNOLOGY AND ELECTRONICS, 44: (11) 1187–1197 November 1999).

An unexpected property of doped semiconductor nanocrystals is that they exhibit quenched fluorescence with the inclusion of as few as one or two carriers. Semiconductor nanocrystals are fluorescent, when undoped, and this has been well studied, as described in Hines, M. A.; Guyot-Sionnest, P. *J. Phys. Chem.* 1996, 100, 468–471; Dabbousi, B. O.; Rodriguez-Viejo, J.; Mikulec, F. V.; Heine, J. R.; Mattoussi, H.; Ober, R.; Jensen, K. F.; Bawendi, M. G. *J. Phys. Chem.* B 1997, 101, 9463–9475; Peng, X. et al. *J. Am. Chem. Soc.* 1997, 119, 7019–7029; Cao, Y.; Banin, U. *Angew. Chem. Int. Ed.* 1999, 38, 3692–3694; and Nirmal, M. et al. *Nature* 1996, 383, 802–804. Unexpectedly, doped semiconductor nanocrystals lose this fluorescence with the inclusion of as few as one or two carriers. This property may be used to make a variety of devices, for example a display.

A display may be made from a film of semiconductor nanocrystals sandwiched between transparent conductive surfaces, such as quartz coated with indium-tin oxide. The conductive coatings are patterned as an addressable array, and as current is applied to parts of the film, electrochemical doping of the semiconductor nanocrystals will take place in that location, quenching fluorescence at that spot (or pixel) only. When this display is illuminated with ultra-violet light, the addressed locations will appear dark; all others will glow. Since the color of semiconductor nanocrystals fluorescence is tunable by selection of composition and nanocrystal size, a color display can be prepared.

Opto-electronic devices may also be prepared using these materials. For example, one or more semiconductor nanocrystals could be placed on an array of electrodes. These semiconductor nanocrystals may be doped or undoped electrochemically. In the undoped form, they would be fluorescent; in the doped form, they would not. In this way, they could be used as a memory array, with light used to detect the doped/undoped state of the nanocrystals.

The appearance of the intraband transition, that may absorb very specific wavelengths of IR light, may also be used to create new devices. For example, an object could be coated with doped semiconductor nanocrystals; the object would then emit IR preferentially at that wavelength. This would cause the object to appear cooler to an IR detector than without such a coating, and could cause an observer to believe that a person is an inanimate object. Furthermore, using electrochemical doping, this effect could be electrically controlled. In a similar fashion, filters for absorbing specific wavelengths of IR light can be prepared from doped semiconductor nanocrystals, and again, these could be electrically controlled.

Doped semiconductor nanocrystal n-p junctions may be made. Reducing the diffusion rate of the ions can be achieved with a polymer electrolyte, for example polyethyleneoxide and molecular moieties that chelate ions, such as the crown ethers. Many conducting polymer electrolytes have been developed for the lithium-ion battery, and the requirement for the n-doped semiconductor nanocrystals being less stringent on the reduction potential to be achieved, these electrolytes may be directly used. A recent review on these polymer electrolytes is described in Meyer, Adv. Mater. 10, 439 (1998)). A composite of a polymer electrolyte and doped semiconductor nanocrystals, preferably n-doped semiconductor nanocrystals, may be used in an n-p junction.

EXAMPLES

Figure 1:
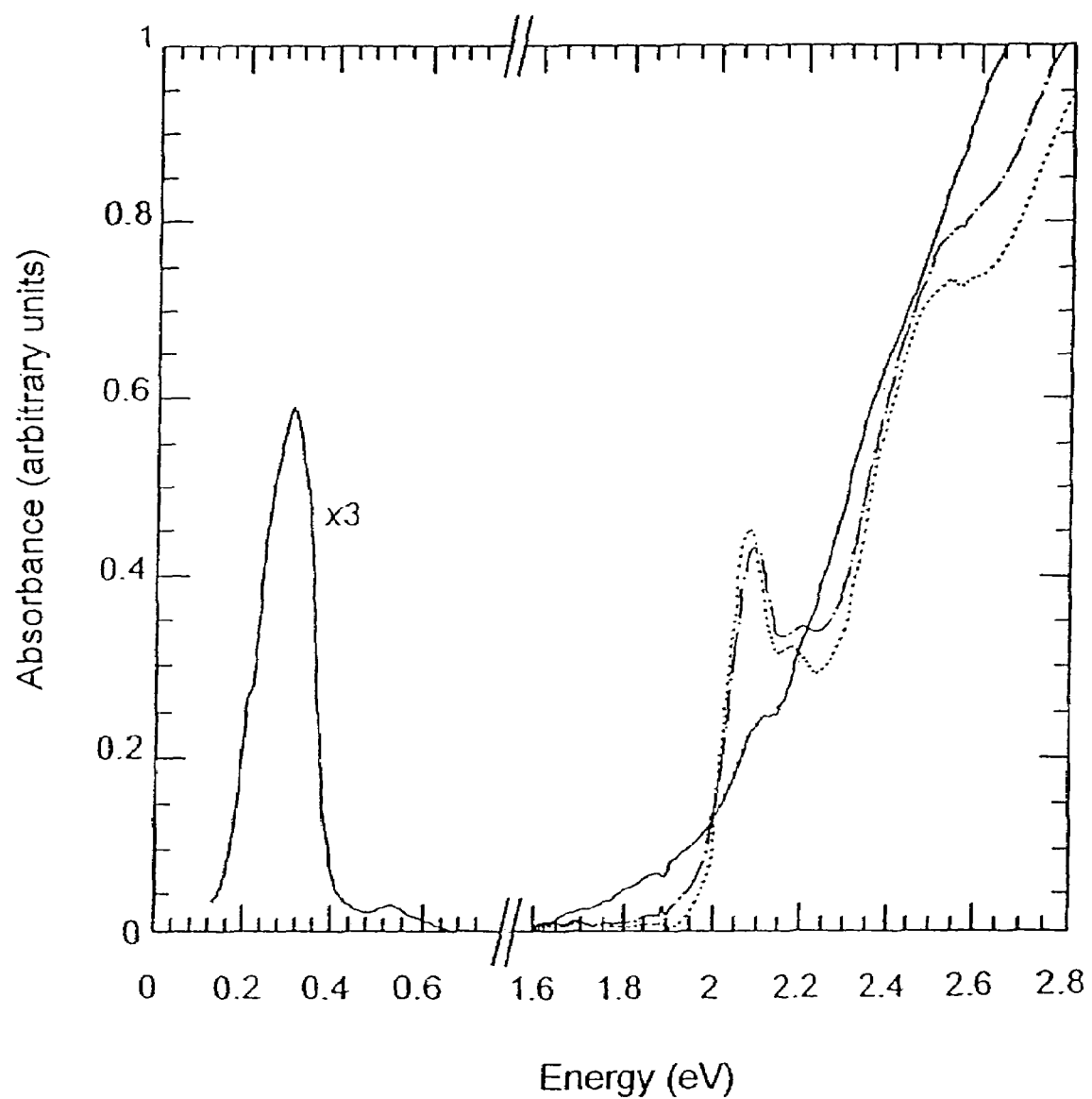
FIG. 1. Absorption spectra of CdSe nanocrystals before (dotted line), immediately after (solid line), and 27 hours after (dashed line) the addition of sodium biphenyl reagent.

In FIG. 1, IR and visible absorption spectra of 5.2 nm CdSe nanocrystals before (dotted line) and ~1 minute after (solid line) the addition of sodium biphenyl reagent are shown. Upon charge transfer, the first and the second exciton peaks at 2.07 and 2.18 eV, respectively, are strongly bleached and broadened. Broadening is expected if there are charges that can shift the exciton energy by Stark effect and this can also lead to an apparent blue shift. Since the charges may reside in surface states and/or in the delocalized $1S_e$ state, the changes in the visible absorption indicate that electron transfer possibly occurred but do not guarantee that the nanocrystals are n-doped. The true n-doped character of the nanocrystals is unambiguously confirmed by the appearance of the $1S_e$-$1P_e$ IR absorption arising at 0.3 eV.

The long-term stability of the n-type nanocrystals is strongly affected by the presence of water impurity or exposure to air, and as discussed below, the decay is likely due to further oxidation and decomposition. With our CdSe sample preparation, the IR absorption decays within 30 minutes to 24 hours (from the smallest to the largest sizes, respectively). If the solution of nanocrystals and biphenyl anions is intentionally exposed to air, decay occurs within minutes. The duration of the IR absorption also depends on the dryness of the solvent. More hygroscopic solvents such as ethers tend to give faster decay of the IR absorption seen in n-type nanocrystals. The stability of the n-type nanocrystals is also strongly temperature dependent since at 20 K the samples appear to be stable indefinitely (in excess of five weeks). Several hours to days after the complete decay of the IR absorption, there is a recovery of the optical bleach. After recovery, the nanocrystals are of smaller sizes as indicated by the blue-shift of the optical absorption features shown in FIG. 1 (dashed line). The blue-shift from 2.07 to 2.08 eV corresponds to a reduction in size of ~2 Å in diameter. Note that the IR absorption and the optical bleach can be "turned on" again by the addition of more sodium biphenyl reagent.

If no excess capping molecules are present in the solution, a slow precipitation of the nanocrystals occurs. TOPO present in solution prevents this slow precipitation. Since the reduction potential of $Cd/Cd^{2+}$ is −0.403 V vs. SHE, near or below the position of the lowest quantum-confined state of CdSe nanocrystals, the most likely pathway for the decomposition of n-type CdSe nanocrystals is via oxidation with loss of electrons in Cd/TOPO complexes in solution. As expected, smaller n-type nanocrystals with larger degrees of confinement are less stable. Determining which systems can be made n-type by the electron transfer method and the thermodynamic stability of the n-type nanocrystals may simply be approached by looking at the reduction potential of the nanocrystals and of the constituent elements. For example, n-type ZnSe nanocrystals may be less stable since the reduction potential of $Zn/Zn^{2+}$ is −0.762 V vs. SHE while the conduction band minimum of bulk ZnSe is near −1.5 V vs. SHE[10]. On the other hand, ZnO, with its valence band minimum near the reduction potential of hydrogen[10], should be an excellent candidate. In fact, charge transfer to ZnO nanocrystal has been previously investigated by electrochemistry but the UV-visible optical spectra could not distinguish between electron transfer to trap states or to the LUQCO.

Figure 3:
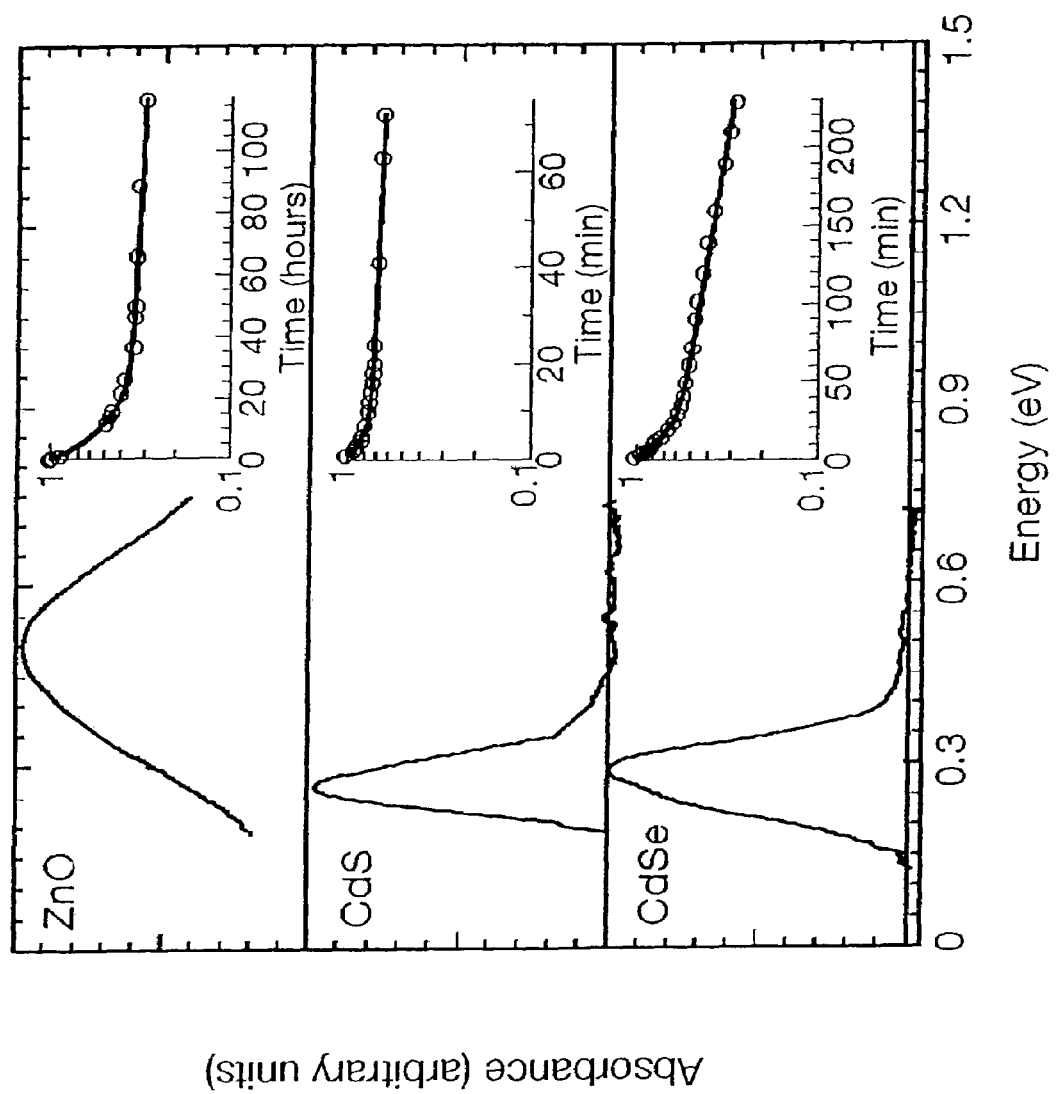
FIG. 3. IR absorption spectra of n-type ZnO (4.4 nm), CdS (7 nm), and CdSe (5.4 nm) nanocrystals. The insets are the corresponding time evolution of the IR absorbance maximum normalized for comparison. Note that the x-axis of the inset for ZnO is in hours.
Figure 4:
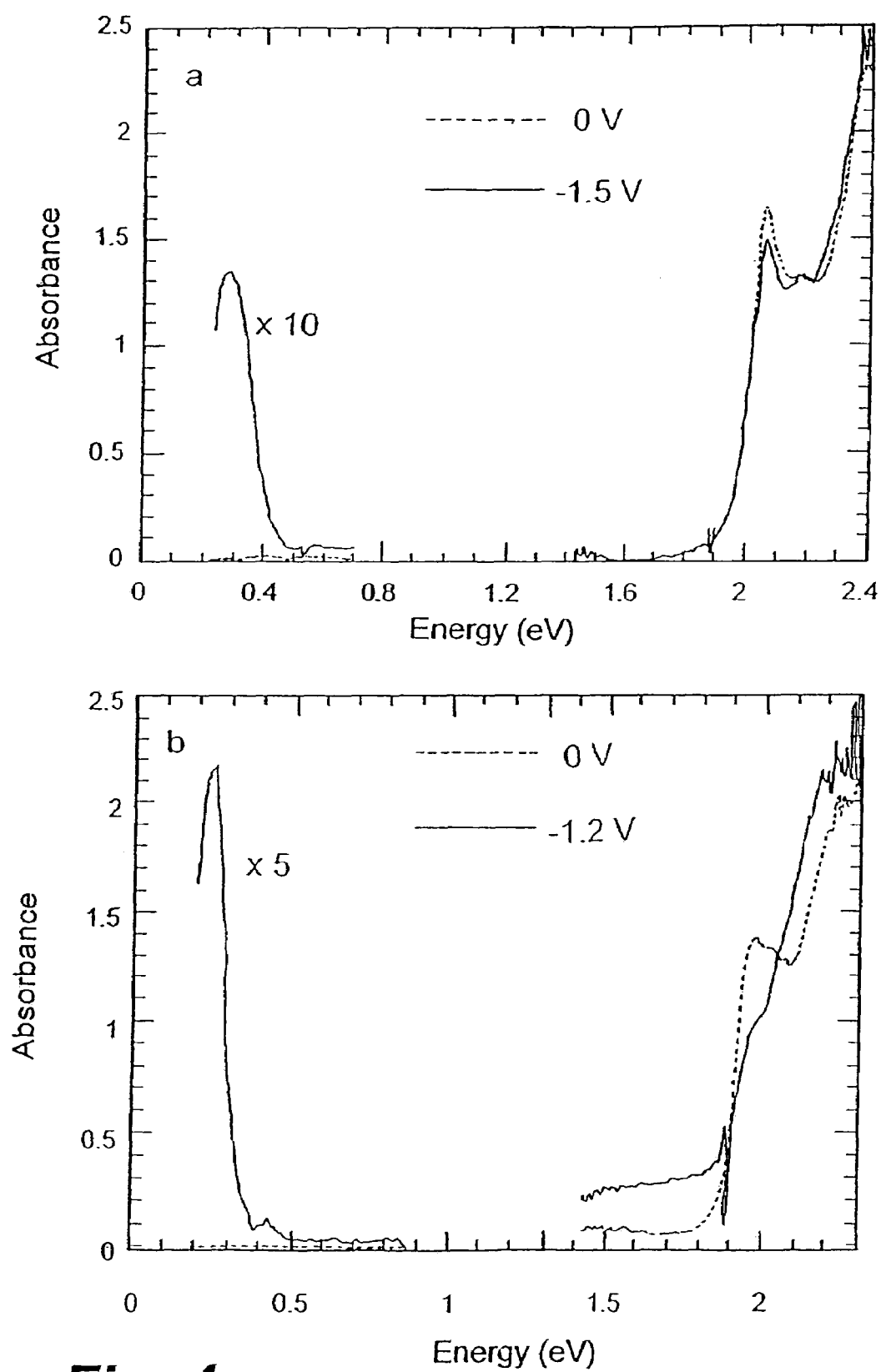
FIG. 4. IR and UV/VIS spectra at different potentials of (a) 5.4 nm CdSe nanocrystals, and (b) 7.0 nm CdSe nanocrystals.
Figure 5:
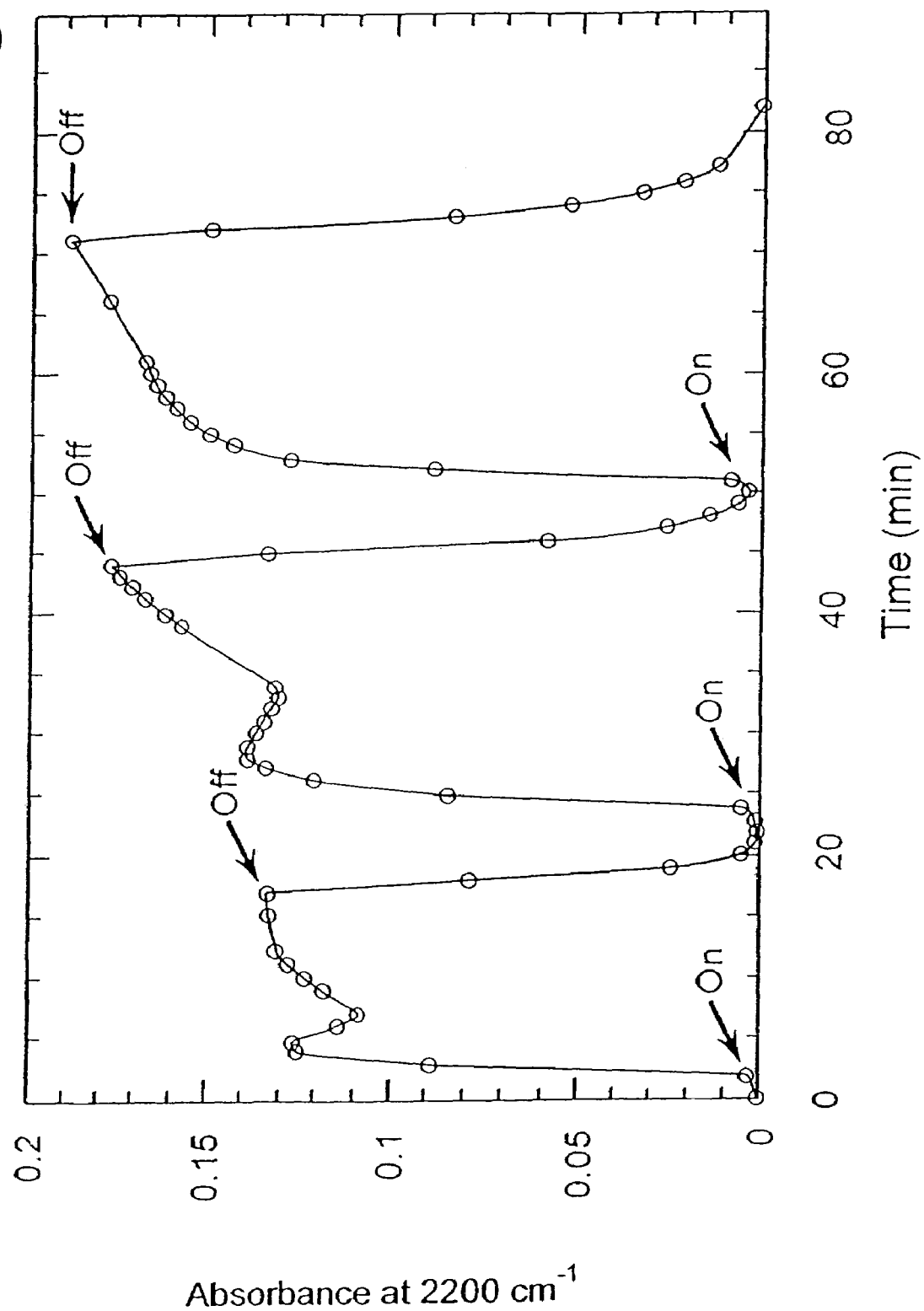
FIG. 5. $1S_e$-$1P_e$ IR absorbance at 2200 $cm^{-1}$ of 5.4 nm CdSe nanocrystals. The absorption is turned on by applying −1.5 V of potential on the nanocrystals, and turned off by resetting the potential to 0 V. The points marked with "on" and "off" are those at which the potential is set to −1.5 V and reset to 0 V, respectively.

FIG. 3 shows the IR absorption spectra of n-type ZnO, CdS, and CdSe nanocrystals prepared by the electron transfer method. The bleach and the blue-shift of the band edge absorption are observed in all three types of nanocrystals. The relatively broader IR absorption band of ZnO may be attributed to a larger size distribution ((σ~25%) as well as to a stronger electron-phonon interaction. The insets of FIG. 3 are the corresponding time evolution of the maximum IR absorbance. As expected from the relative reduction potentials of the semiconductor and of the constituent elements, n-type ZnO nanocrystals are more stable than CdS and CdSe. At room temperature, approximately 30% of the initial IR absorption is observed 5 days after the initial preparation of n-type ZnO nanocrystals, whereas the IR absorption completely decays in less than 2 days for both CdS and CdSe nanocrystals. The intrinsic limit of this electron injection method should be the point at which the sum of the confinement energy, the charging energy and the position of the conduction band minimum reaches the reduction potential of the reducing species.

Preparation of N-Doped Nanocrystals.

To 0.3 ml of dried and deaerated solution of semiconductor nanocrystals with a small amount of TOPO (<5 mg/ml) in 2,2,4,4,6,8,8-heptamethylnonane, ~10 to 50 μl of 1.2 M sodium biphenyl is added. The concentrations of nanocrystals are such that the optical density of the sample at the first exciton maximum is between 0.5 and 1.5 for 200 μm path length. Samples are prepared and filled into a cell in the absence of oxygen and closed in a $N_2$ filled glove box.

Optical Measurements.

PL (photoluminescence) spectra are measured with Perkin Elmer LS 50 B luminescence spectrometer. IR spectra are obtained with Nicolet Magna 560 FTIR spectrometer. Ultraviolet/visible (UV/VIS) spectra are obtained with HP 8453 photodiode array spectrometer. All measurements are carried out at room temperature. The cell is made of one $CaF_2$ window and a sapphire window separated by a teflon spacer, and is capped with teflon stopcocks. For all experiments discussed herein, samples are brought out of the glove box after capping and left standing in ambient conditions during and in between measurements. While the cell is solvent-tight, long exposure to air causes oxidation of the samples.

CdSe Nanocrystals

Colloidal nanocrystals of CdSe having trioctylphosphine oxide (TOPO) capping groups on the surface, are prepared similarly as methods described in C. B. Murray, D. J. Norris, and M. G. Bawendi, *J. Am. Chem. Soc.* 115, 8706 (1993); and J. E. Bowen Katari, V. L. Colvin, and A. P. Alivisatos, *J. Phys. Chem.* 98, 4109 (1994). To 12 g of degassed TOPO, a solution of dimethylcadmium ($CdMe_2$) and trioctylphosphine selenide (TOPSe) in trioctylphosphine (TOP) is quickly injected at about 350° C. The Cd/Se solution is prepared in an inert atmosphere by diluting 0.7 ml of $CdMe_2$ and 0.5 ml of TOPSe (both are 1 M solution in TOP) with 6 ml of TOP. The growth temperature is 270° C. and the growth time is varied depending on the desired size. The growth of nanocrystals is monitored by UV/VIS absorption spectra. For large nanocrystals (core diameter>50 Å), additional injection of Cd/Se reagent may be necessary if initial growth ceases. The reaction is stopped when the absorption spectrum corresponds to that of desired size range. Upon cooling to ambient temperature, the reaction mixture is purified and size-selectively precipitated with anhydrous $CHCl_3$/MeOH resulting in CdSe nanocrystals of nearly monodisperse sizes (5–10% size dispersion).

CdSe/ZnS Core/Shell Nanocrystals

Core/shell nanocrystals of CdSe/ZnS having TOPO capping groups are prepared by a two-step method described in M. A. Hines and P. Guyot-Sionnest, *J. Phys. Chem.* 100, 468 (1996). The preparation of the CdSe core is described above. When the desired core size is achieved, the temperature is lowered to 200° C. and a solution of diethylzinc ($ZnEt_2$) and bis(trimethylsilyl)sulfide (($TMS)_2S$) in TOP is slowly injected into the reaction mixture. The amount of $ZnEt_2$ and $(TMS)_2S$ depends on the initial size of CdSe core and desired thickness of ZnS shell. The reaction mixture is cooled to 90° C. immediately after the injection of Zn/S is finished. The nanocrystals are allowed to grow at 90° C. before the reaction is stopped. Upon cooling to ambient temperature, the reaction mixture is purified and size-selectively precipitated with anhydrous $CHCl_3$/MeOH resulting in CdSe/ZnS core/shell nanocrystals. Colloidal nanocrystals of CdSe were made in a similar manner as described in Murray, C. B.; Norris, D. J.; Bawendi, M. G. *J. Am. Chem. Soc.* 1993, 115, 8706–8715. (CdSe)ZnS (core)shell nanocrystals are prepared by the methods described in Hines, M. A.; Guyot-Sionnest, P. *J. Phys. Chem.* 1996, 100, 468–471; and Dabbousi, B. O.; Rodriguez-Viejo, J.; Mikulec, F. V.; Heine, J. R.; Mattoussi, H.; Ober, R.; Jensen, K. F.; Bawendi, M. G. *J. Phys. Chem. B* 1997, 101, 9463–9475.

Spectroelectrochemical Investigations of Nanocrystals

UV/VIS absorption spectra were recorded using an Ocean Optics ST2000 Triple Fiber Optic Spectrometer. Fourier transformed infrared (FTIR) spectra were measured with a Nicolet 550 FTIR spectrometer. The potential is controlled with an Intertech Systems PGS-151 potentiostat. All nanocrystals are precipitated out with MeOH and dried under vacuum for a minimum of 45 minutes. The nanocrystals are then dissolved in a 0.1 M solution of tetrabutylammonium perchlorate (TBAP) in anhydrous tetrahydrofuran (THF). The concentrations of nanocrystals are such that the optical density of the sample at the first exciton maximum is between 1.0 and 2.0 for ~500 μm path length. TBAP is used as the supporting electrolyte and dried at 100° C. under vacuum for at least 12 hours prior to use. THF is purified and dried by distillation over sodium. All measurements are carried out under inert atmosphere in an air-tight spectroelectrochemical cell similar to the one described in R. E. Wittrig, and C. P. Kubiak, *J. Electroanal. Chem.* 393, 75 (1995). The three-electrode system includes a Pt working electrode, a Pt wire counter electrode, and an Ag wire pseudo-reference electrode. The spectroelectrochemical cell is cleaned and dried under vacuum for 45 minutes before use. The nanocrystal solutions are transferred into the cell under an inert atmosphere. The spectroelectrochemical cell is calibrated using a standard solution of 1 mM ferrocene/0.1 M TBAP in THF. The Ag pseudo-reference electrode was found to be offset about 0.1 V with respect to Standard Hydrogen Electrode. All the potential values reported herein are with respect to the Ag pseudo-reference electrode.

Obviously, numerous modifications and variations of the present invention are possible in light of the above teachings. It is therefore to be understood that within the scope of the appended claims, the invention may be practiced otherwise than as specifically described herein.

The invention claimed is:

1. A photovoltaic device, comprising:
a semiconductor nanocrystal for the photovoltaic device, wherein said nanocrystal is doped with an electron, such that the electron is in a quantum confined state at room temperature and in the absence of an applied electric potential.

2. The photovoltaic device of claim 1, wherein said nanocrystal is n-doped.

3. The photovoltaic device of claim 2, wherein said nanocrystal comprises a 2–6 semiconductor compound.

4. The photovoltaic device of claim 3, wherein said nanocrystal is selected from the group consisting of zinc oxide, cadmium sulfide and cadmium selenide.

5. The photovoltaic device of claim 1, comprising a film, said film comprising at least one of said semiconductor nanocrystal.

6. The photovoltaic device of claim 1, further comprising at least one capping group on the surface of said nanocrystal.

7. The photovoltaic device of claim 3, comprising a film of the semiconductor nanocrystals.

* * * * *